United States Patent
Kim et al.

(10) Patent No.: US 12,424,869 B2
(45) Date of Patent: Sep. 23, 2025

(54) ENERGY STORAGE SYSTEM, AND DEVICE FOR CONTROLLING GROUND STRUCTURE OF ENERGY STORAGE SYSTEM

(71) Applicant: LG ENERGY SOLUTION, LTD., Seoul (KR)

(72) Inventors: Jongcheol Kim, Daejeon (KR); Byeongho Mun, Daejeon (KR); Inho Jung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/692,162

(22) PCT Filed: Jan. 6, 2023

(86) PCT No.: PCT/KR2023/000311
§ 371 (c)(1),
(2) Date: Mar. 14, 2024

(87) PCT Pub. No.: WO2023/204382
PCT Pub. Date: Oct. 26, 2023

(65) Prior Publication Data
US 2024/0364133 A1    Oct. 31, 2024

(30) Foreign Application Priority Data
Apr. 19, 2022    (KR) ........................ 10-2022-0047876

(51) Int. Cl.
*H02J 7/35* (2006.01)
*G01R 31/52* (2020.01)
*H02J 3/32* (2006.01)

(52) U.S. Cl.
CPC ................ *H02J 7/35* (2013.01); *G01R 31/52* (2020.01); *H02J 3/32* (2013.01); *H02J 2300/24* (2020.01)

(58) Field of Classification Search
CPC . H02J 7/35; H02J 3/32; H02J 2300/24; G01R 31/52
See application file for complete search history.

(56) References Cited

U.S. PATENT DOCUMENTS

| | | |
|---|---|---|
| 9,599,651 B2 | 3/2017 | Weiss et al. |
| 11,085,974 B2 | 8/2021 | Sugawara et al. |
| 2022/0292561 A1 | 9/2022 | Tate |

FOREIGN PATENT DOCUMENTS

| | | |
|---|---|---|
| CN | 110896227 A | 3/2020 |
| EP | 0 679 898 A2 | 11/1995 |

(Continued)

OTHER PUBLICATIONS

International Search Report (PCT/ISA/210) issued in PCT/KR2023/000311, dated Apr. 14, 2023.

(Continued)

*Primary Examiner* — Robert L Deberadinis
(74) *Attorney, Agent, or Firm* — Birch, Stewart, Kolasch & Birch, LLP

(57) ABSTRACT

Discussed is an energy storage system connected with a power grid, and including: a photovoltaic (PV) system; a power conversion system to be connected with the power grid and selectively connected to the photovoltaic system; a first switch to selectively connect the photovoltaic system and a direct current (DC) link of the power conversion system; a first ground fault detector including a terminal connected to a ground; a second switch selectively to connect the photovoltaic system and another terminal of the first ground fault detector; and a switch controller to change a ground structure of at least one of the photovoltaic system, the power conversion system, and a battery system included in the energy storage system and to selectively connect the photovoltaic system and the DC link, by controlling the first (Continued)

switch and the second switch based on a power generation state of the photovoltaic system.

21 Claims, 13 Drawing Sheets

(56) References Cited

FOREIGN PATENT DOCUMENTS

| | | |
|---|---|---|
| EP | 2 741 093 A1 | 6/2014 |
| JP | 2010-199443 A | 9/2010 |
| JP | WO2013/015097 A1 | 1/2013 |
| KR | 10-1336043 B1 | 12/2013 |
| KR | 10-1380530 B1 | 4/2014 |
| KR | 10-2081897 B1 | 2/2020 |
| KR | 10-2020-0065290 A | 6/2020 |
| KR | 10-2020-0065910 A | 6/2020 |
| KR | 10-2320867 B1 | 11/2021 |
| KR | 10-2022-0047876 A | 4/2022 |
| WO | WO 2015/015836 A1 | 2/2015 |

OTHER PUBLICATIONS

Extended European Search Report for European Application No. 23791966.7, dated Jan. 2, 2025.

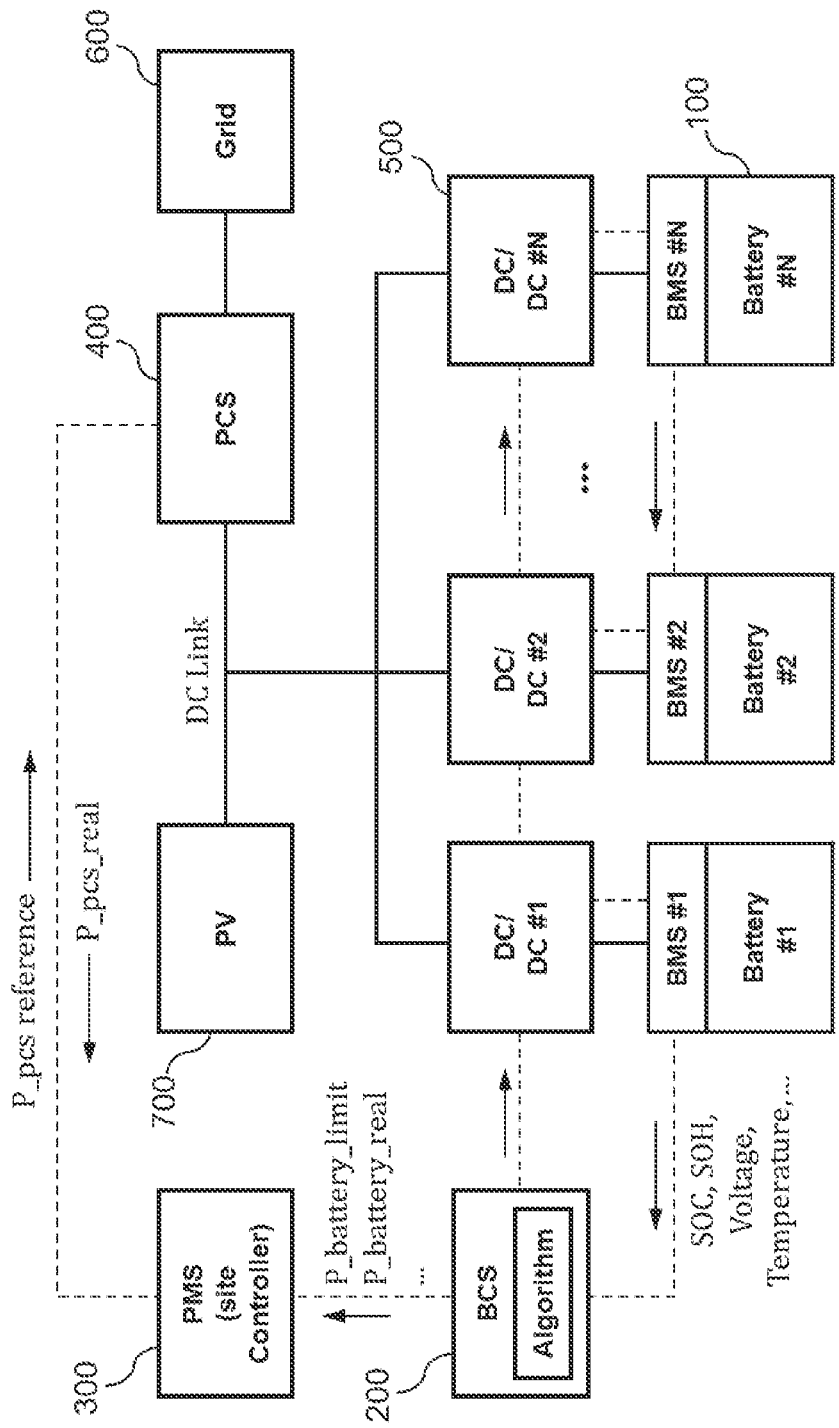
[Figure 1]

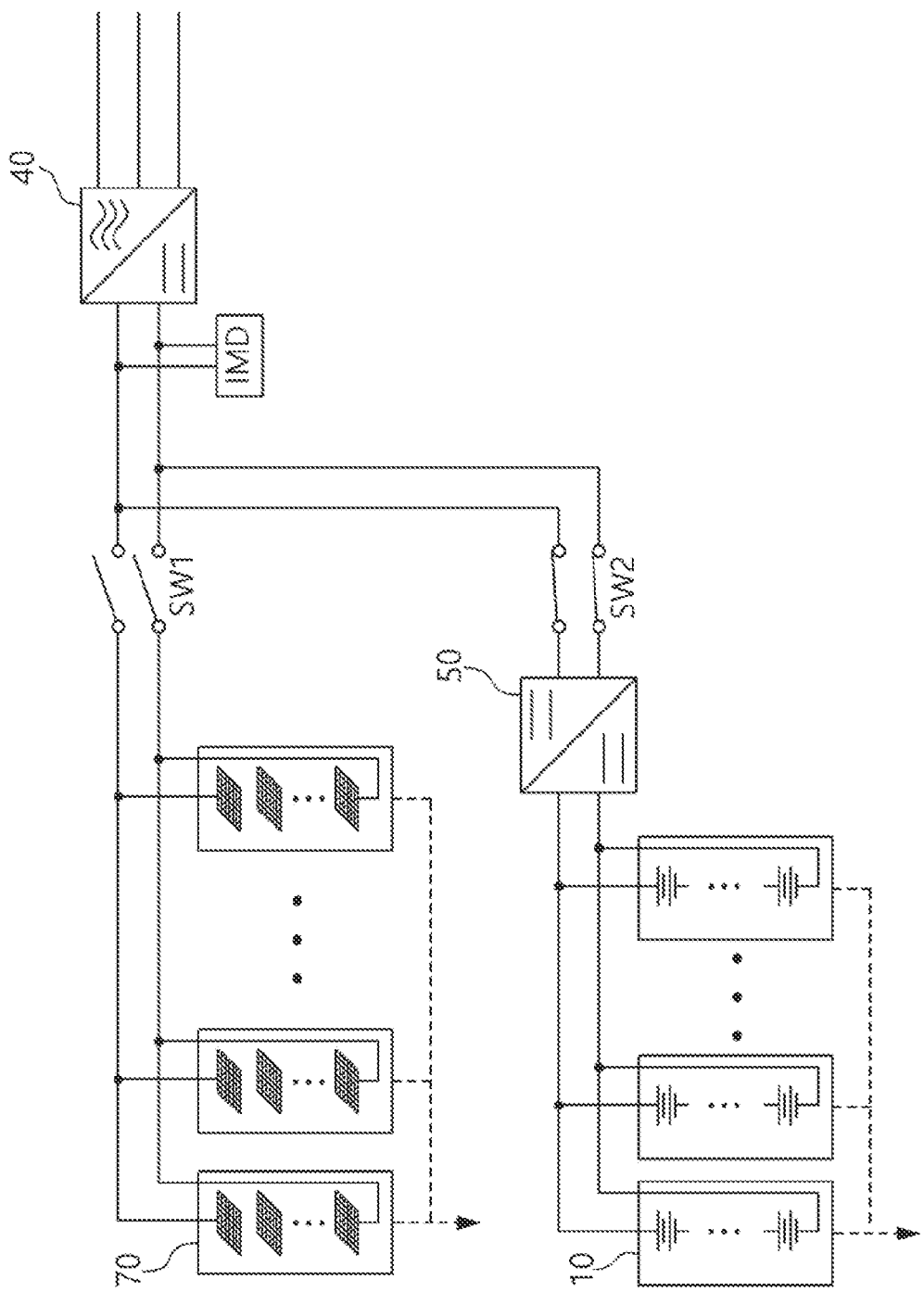
[Figure 2A]

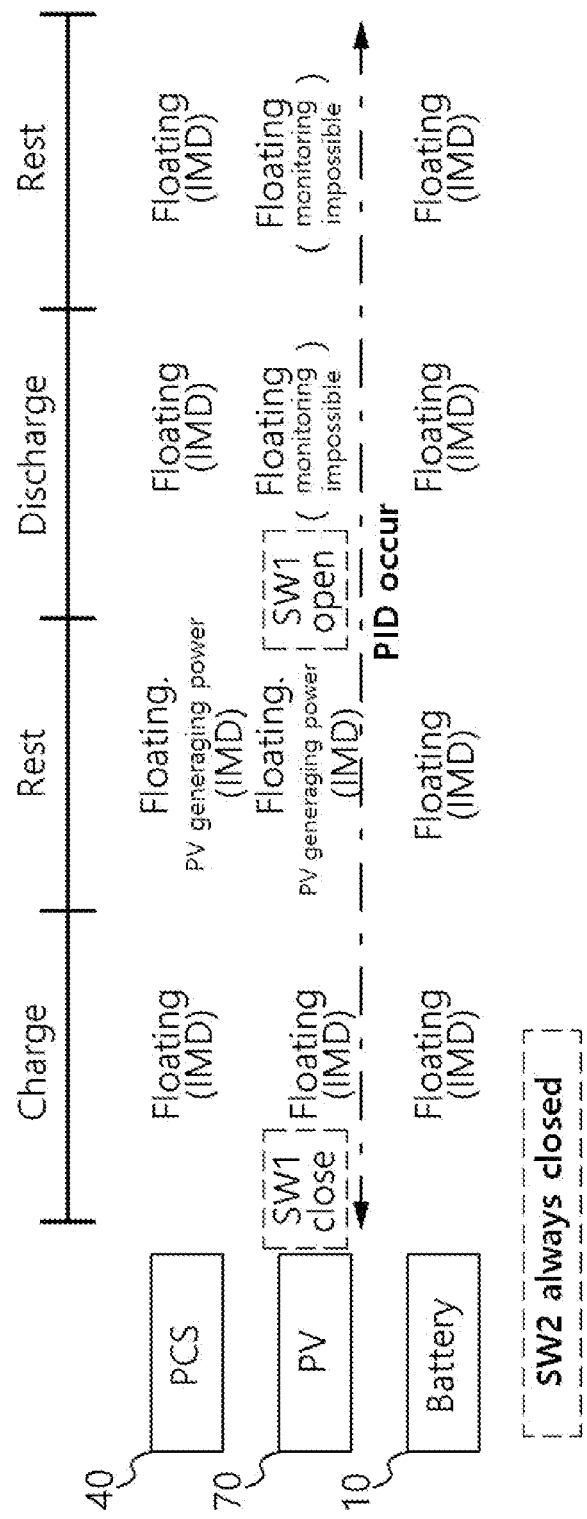

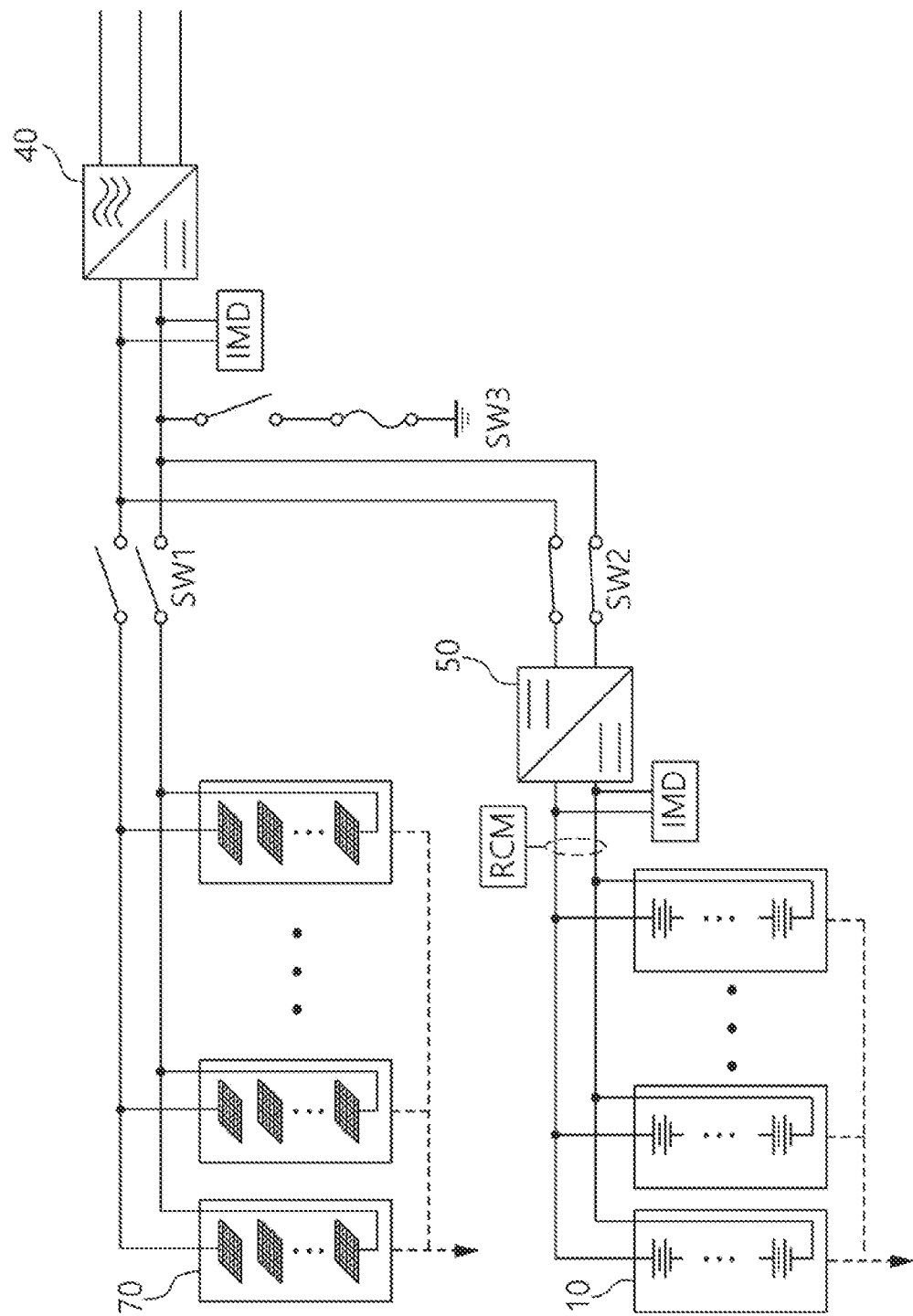
[Figure 3A]

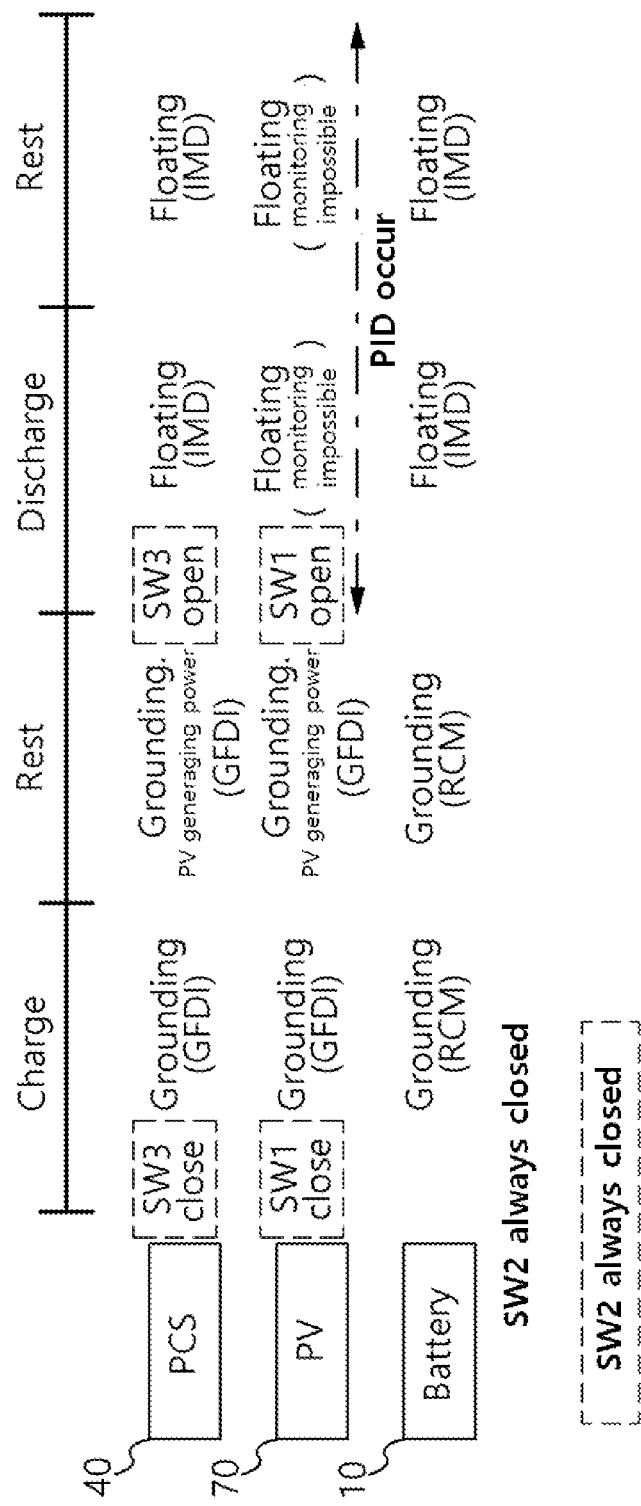

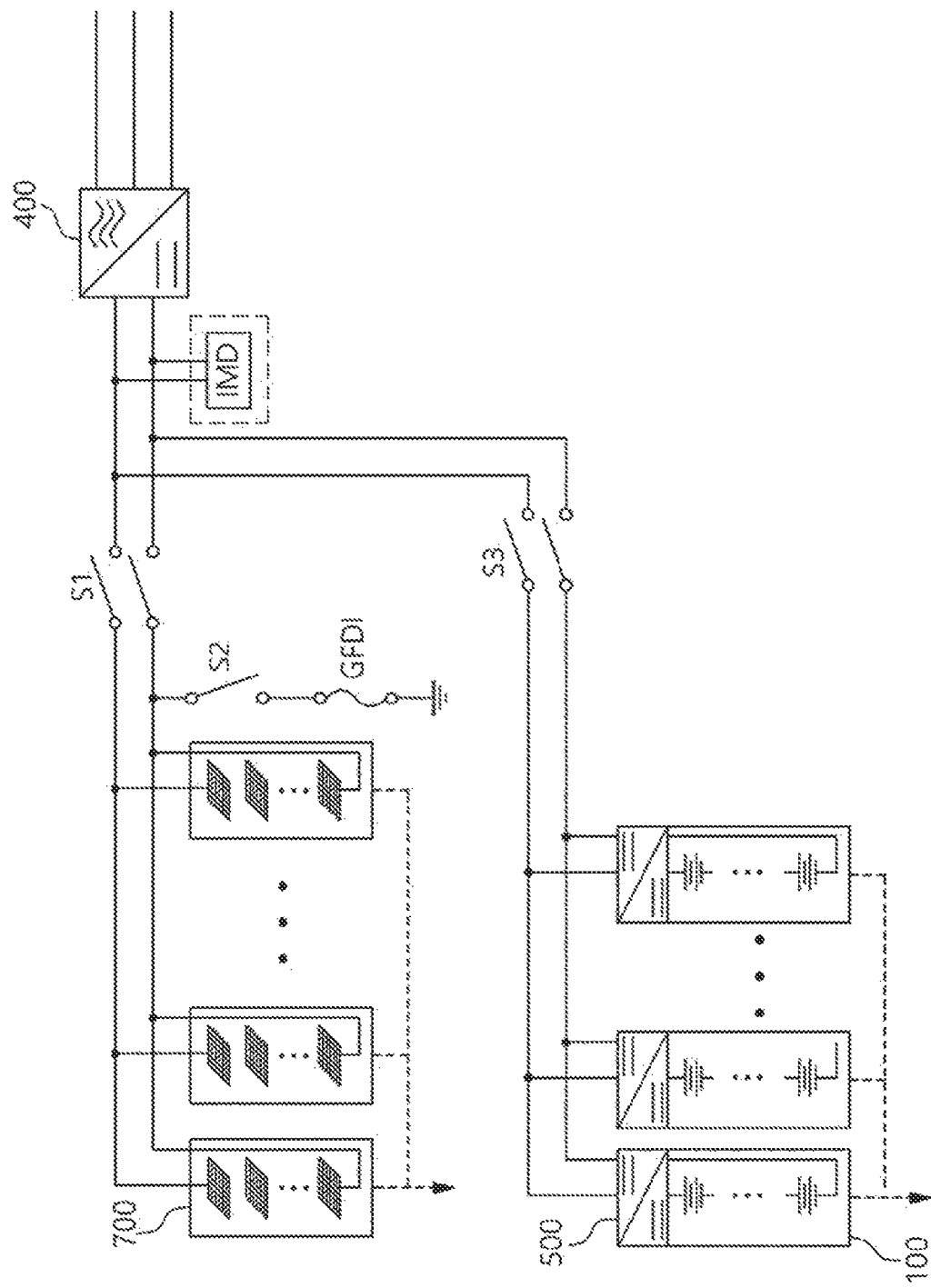
[Figure 4]

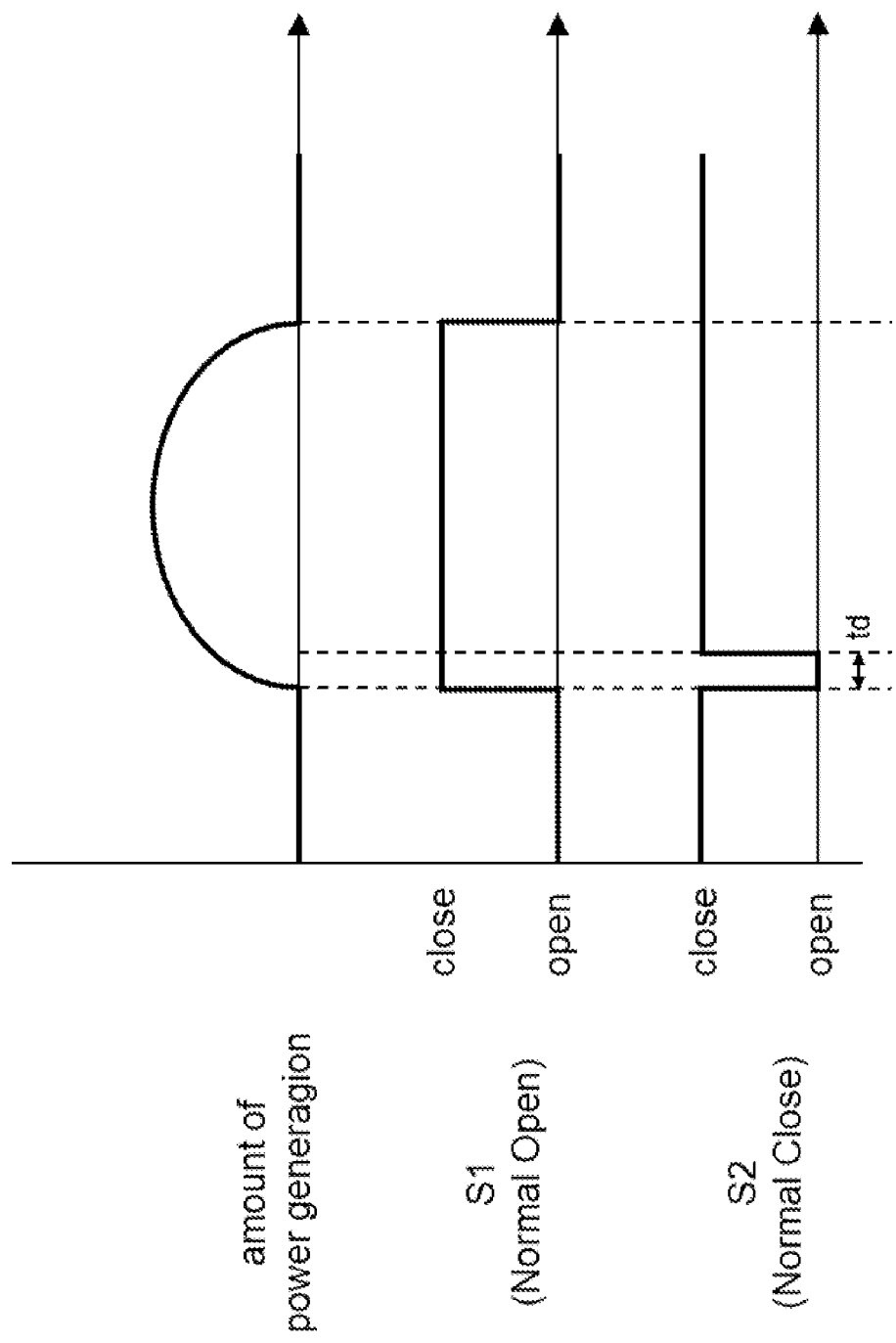

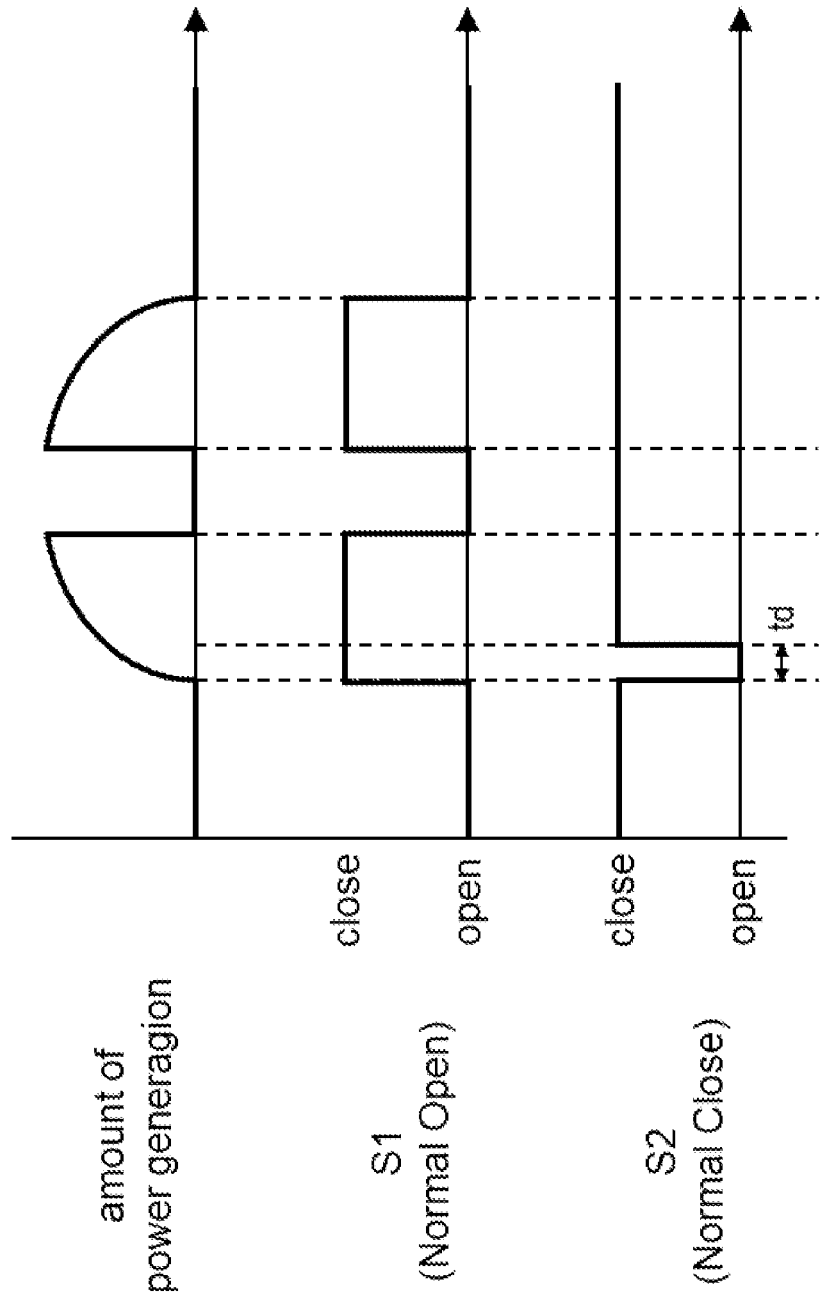

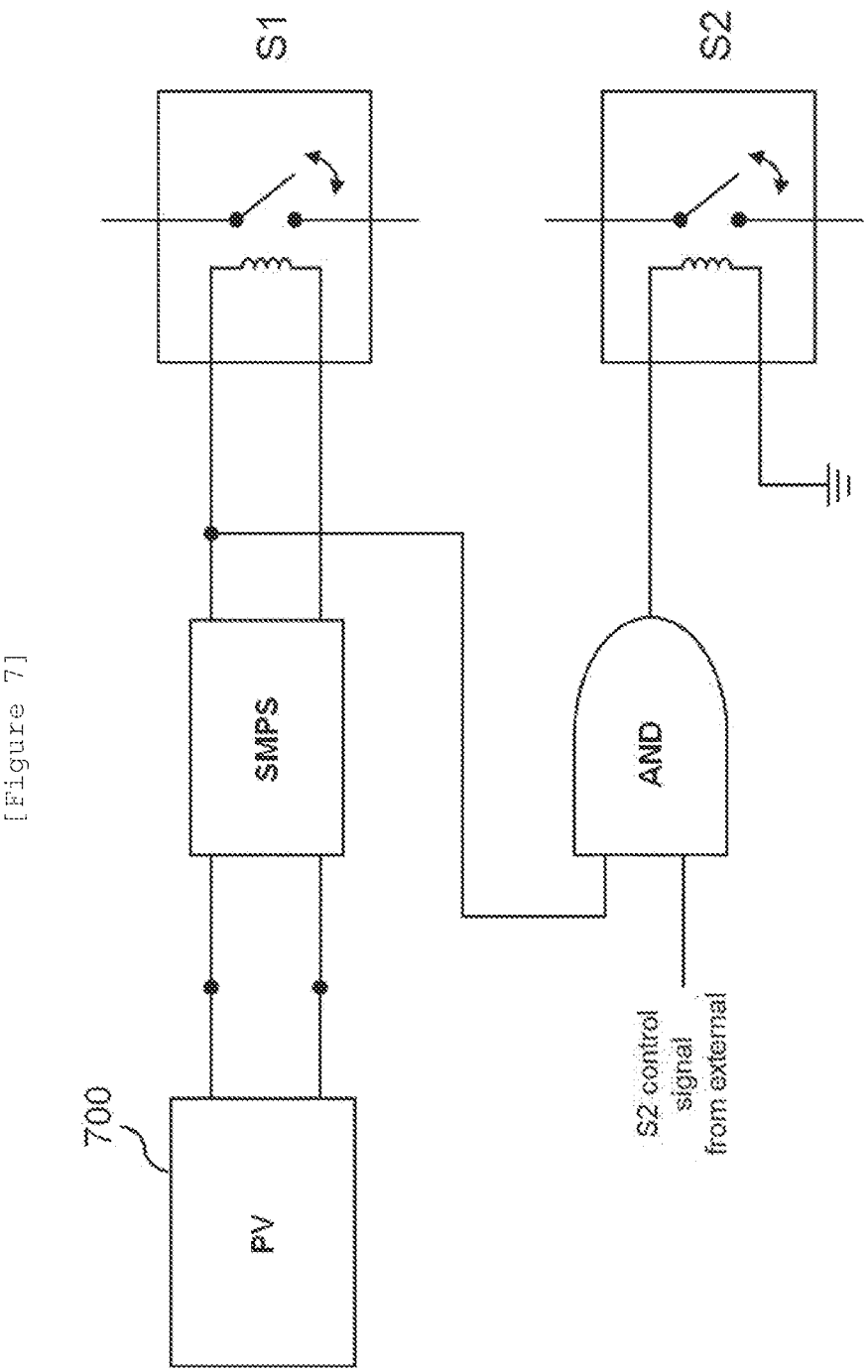

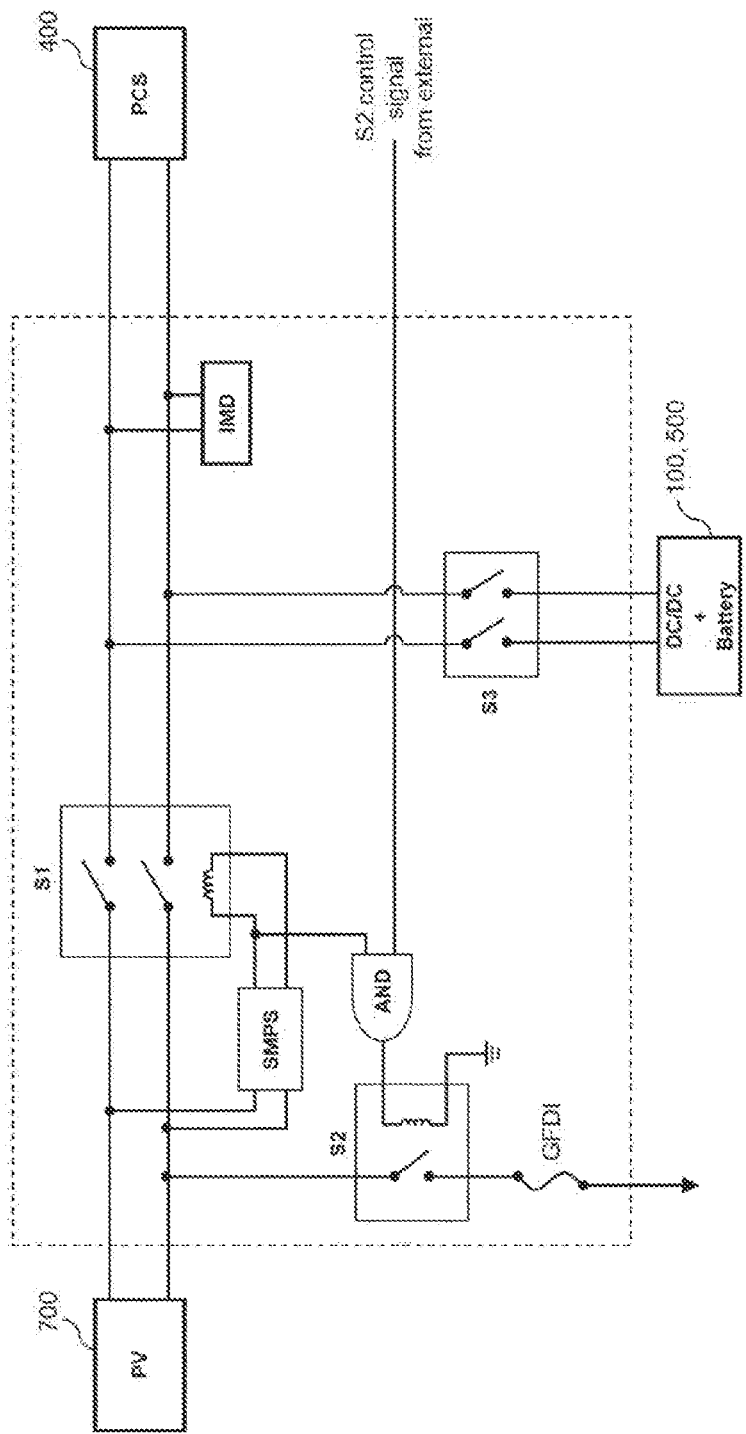
[Figure 8]

[Figure 9]
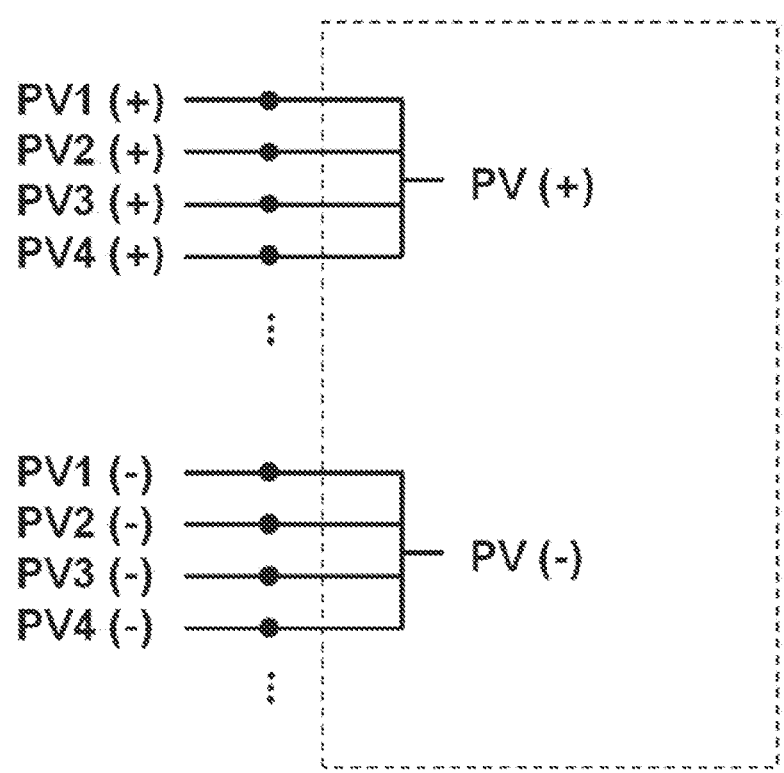

[Figure 10]
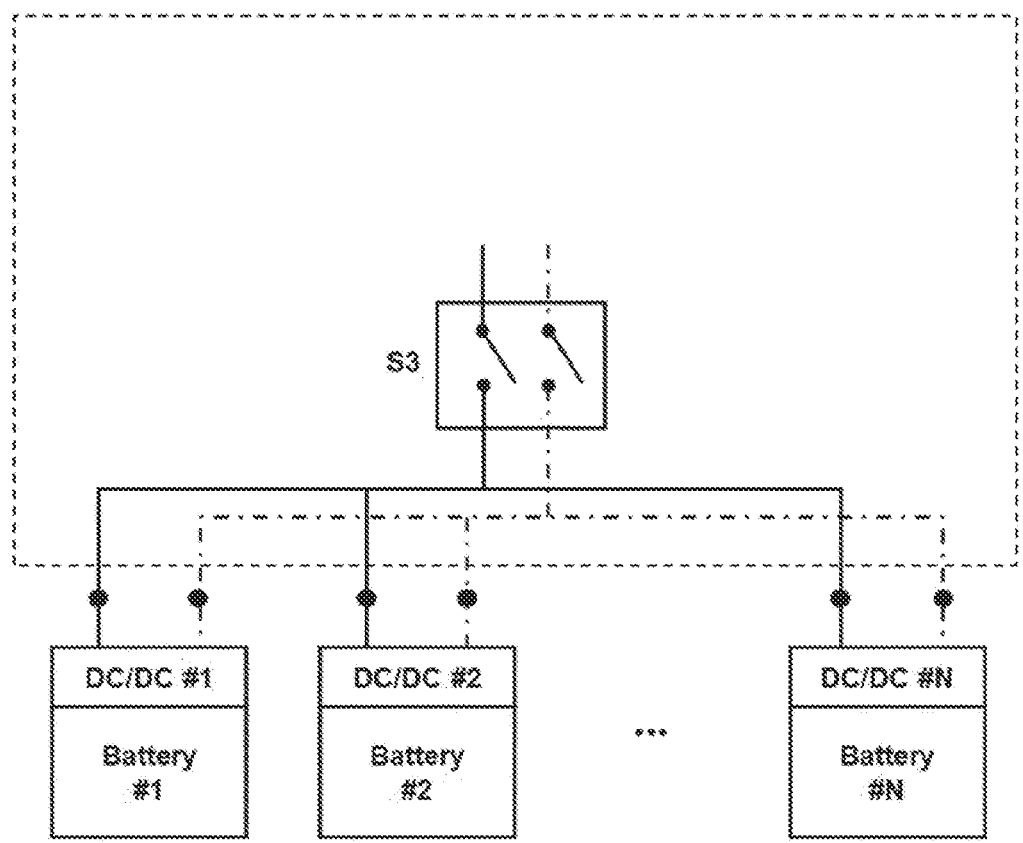

[Figure 11]
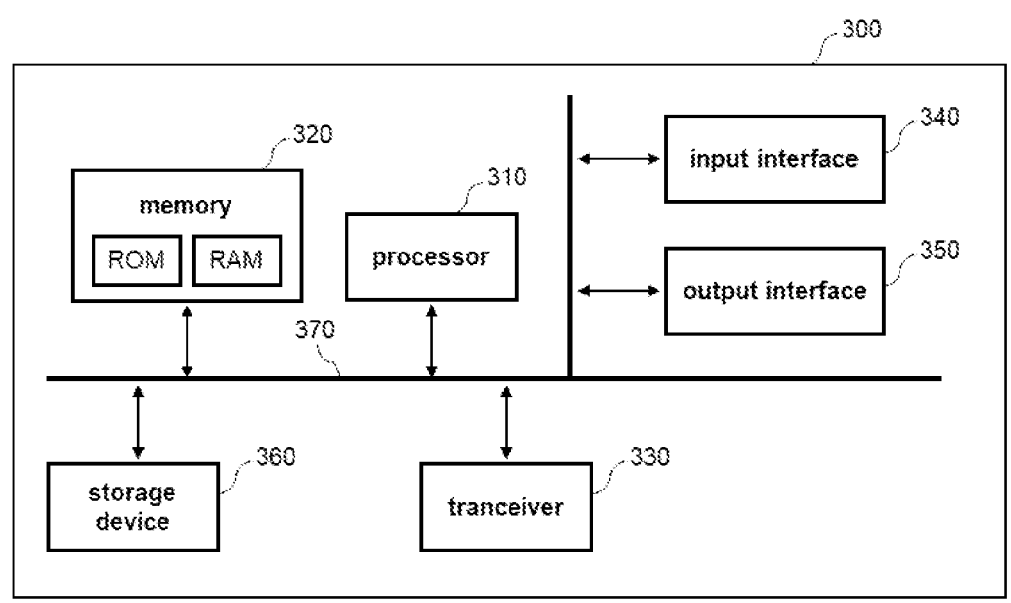

ENERGY STORAGE SYSTEM, AND DEVICE FOR CONTROLLING GROUND STRUCTURE OF ENERGY STORAGE SYSTEM

CROSS-REFERENCE TO RELATED APPLICATIONS

This application claims priority to and the benefit of Korean Patent Application No. 10-2022-0047876 filed in the Korean Intellectual Property Office on Apr. 19, 2022, the entire contents of which are incorporated herein by reference.

BACKGROUND

The present invention relates to an energy storage system and an apparatus for controlling ground configuration of the energy storage system, and more particularly, to an energy storage system including a photovoltaic system, an apparatus for controlling ground configuration of the energy storage system, and a switch control apparatus for controlling ground configuration of the energy storage system.

DISCUSSION OF THE RELATED ART

An energy storage system relates to renewable energy, a battery that stores electric power, and an existing power grid. Recently, as spread of smart grid and renewable energy is expanding and the efficiency and the stability of the power system are emphasized, a demand for energy storage systems for power supply and demand control and power quality improvement is increasing. Depending on a purpose of use, energy storage systems may have different output and capacity. In order to configure a large-capacity energy storage system, a plurality of battery systems may be connected.

Among energy storage systems, a system connected with a photovoltaic (PV) system is changing from an AC-coupled system to a DC-coupled system. In a DC-coupled ESS system, the photovoltaic system and the battery system are DC voltage systems, but the grid is an AC voltage system, and thus, a power conversion system is needed.

Meanwhile, a PV system and a battery system generally use different grounding methods due to system efficiency or safety issues. Here, in an energy storage system in which a PV system and a battery system are interlocked, which grounding method to use becomes a matter of choosing between system efficiency and safety, and thus, a difficulty arises in system operation that one of system efficiency and safety must be given up.

SUMMARY OF THE DISCLOSURE

To obviate one or more problems of the related art, embodiments of the present disclosure provide an energy storage system including a photovoltaic (PV) system.

To obviate one or more problems of the related art, embodiments of the present disclosure also provide an apparatus for controlling ground configuration of the energy storage system.

To obviate one or more problems of the related art, embodiments of the present disclosure also provide a switch control apparatus for controlling ground configuration of the energy storage system.

According to embodiments of the present disclosure in order to achieve the objective of the present disclosure, an energy storage system connected with a power grid, may include: a photovoltaic (PV) system; a power conversion system (PCS) configured to be connected with the power grid and selectively connected to the photovoltaic system; a first switch configured to selectively connect the photovoltaic system and a direct current (DC) link of the power conversion system; a first ground fault detector including a terminal which is connected to a ground; a second switch selectively configured to connect the photovoltaic system and another terminal of the first ground fault detector, wherein the second switch is located between the first switch and the photovoltaic system; and a switch controller configured to change a ground structure of at least one of the photovoltaic system, the power conversion system, and a battery system included in the energy storage system and to selectively connect the photovoltaic system and the DC link of the power conversion system, by controlling the first switch and the second switch based on a power generation state of the photovoltaic system.

The switch controller may be further configured to: upon the photovoltaic system operating in the power generating state, operate the first switch and the second switch in a closed state to apply a grounding ground structure to the photovoltaic system and the power conversion system so that the first ground fault detector detects whether a ground fault occurs in the photovoltaic system and the power conversion system.

The switch controller may be further configured to: upon the photovoltaic system switching from a non-power generating state to the power generating state, operate the second switch in an open state for a predetermined time to apply a floating ground structure to the photovoltaic system and the power conversion system so that a second ground fault detector located at a DC link input node of the power conversion system detects whether the ground fault occurs in the photovoltaic system and the power conversion system.

The switch controller may be further configured to: upon the photovoltaic system being in a non-power generating state, operate the first switch in an open state and the second switch in a closed state to apply a grounding ground structure to the photovoltaic system and a floating ground structure to the power conversion system so that the first ground fault detector detects whether the ground fault occurs in the photovoltaic system.

The energy storage system may further include a second ground fault detector located at a direct current (DC) link input node of the power conversion system. Here, the second ground fault detector may be configured to detect whether the ground fault occurs in the power conversion system.

The first switch may operate as a normally open switch, the switch controller may include a first switch driving circuit configured to drive the first switch by receiving power generated by the photovoltaic system, and the switch controller operates the first switch in a closed state in an instance that the photovoltaic system is in a power generating state.

The second switch may operate as a normally closed switch and the switch controller may include a second switch driving circuit configured to drive the second switch by receiving power generated by the photovoltaic system.

The second switch driving circuit may be configured to be driven by the power when a control signal is received from an external control device and to open the second switch in an instance that the photovoltaic system is in the power generating state and the control signal is input.

The energy storage system may further include the battery system connected to a DC link input node of the power conversion system.

The first ground fault detector may include a ground fault detection interrupter (GFDI).

The second ground fault detector may include an insulation monitoring device (IMD).

According to embodiments of the present disclosure in order to achieve the objective of the present disclosure, an apparatus for controlling a ground configuration of an energy storage system which is connected to a power grid, the energy storage system including a photovoltaic (PV) system and a power conversion system (PCS) selectively connected to the photovoltaic system, the apparatus include: a first switch configured to selectively connect the photovoltaic system and a direct current (DC) link of the power conversion system; a first ground fault detector including a terminal which is connected to a ground; a second switch selectively configured to connect the photovoltaic system and another terminal of the first ground fault detector, wherein the second switch is located between the first switch and the photovoltaic system; and a switch controller configured to change a ground structure of at least one of the photovoltaic system, the power conversion system, and a battery system included in the energy storage system and to selectively connect the photovoltaic system and the DC link of the power conversion system, by controlling the first switch and the second switch based on a power generation state of the photovoltaic system.

The switch controller may be further configured to: upon the photovoltaic system operating in the power generating state, operate the first switch and the second switch in a closed state to apply a grounding ground structure to the photovoltaic system and the power conversion system so that the first ground fault detector detects whether a ground fault occurs in the photovoltaic system and the power conversion system.

The switch controller may be further configured to: upon the photovoltaic system switching from a non-power generating state to the power generating state, operate the second switch in an open state for a predetermined time to apply a floating ground structure to the photovoltaic system and the power conversion system so that a second ground fault detector located at a DC link input node of the power conversion system detects whether the ground fault occurs in the photovoltaic system and the power conversion system.

The switch controller may be further configured to: upon the photovoltaic system being in a non-power generating state, operate the first switch in an open state and the second switch in a closed state to apply a grounding ground structure to the photovoltaic system and a floating ground structure to the power conversion system so that the first ground fault detector detects whether a ground fault occurs in the photovoltaic system.

The apparatus for controlling ground configuration may further include a second ground fault detector located at a direct current (DC) link input node of the power conversion system and the second ground fault detector may be configured to detect whether the ground fault occurs in the power conversion system.

The first switch may operate as a normally open switch, the switch controller may include a first switch driving circuit configured to drive the first switch by receiving power generated by the photovoltaic system, and the switch controller operates the first switch in a closed state in an instance that the photovoltaic system is in the power generating state.

The second switch may operate as a normally closed switch and the switch controller may include a second switch driving circuit configured to drive the second switch by receiving power generated by the photovoltaic system.

The second switch driving circuit may be configured to be driven by the power when a control signal is received from an external control device and to open the second switch in an instance that the photovoltaic system is in the power generating state and the control signal is input.

The apparatus for controlling ground configuration may further include a third switch selectively connecting a direct current (DC) link input node of the power conversion system and the battery system.

The third switch may operate in a closed state while the photovoltaic system is the power generating state and a non-power generating state.

According to embodiments of the present disclosure in order to achieve the objective of the present disclosure, a switch control apparatus in an energy storage system connected with a power grid, wherein the energy storage system includes a photovoltaic (PV) system, a power conversion system (PCS) selectively connected to the photovoltaic system, a first switch configured to selectively connect the photovoltaic system and a direct current (DC) link of the power conversion system, a first ground fault detector including a terminal which is connected to a ground, a second switch selectively configured to connect the photovoltaic system and another terminal of the first ground fault detector, wherein a second switch is located between the first switch and the photovoltaic system, the apparatus may include an instruction to check a state of the photovoltaic system and an instruction to change a ground structure of at least one of the photovoltaic system, the power conversion system, and a battery system included in the energy storage system and to selectively connect the photovoltaic system and the DC link of the power conversion system, by controlling the first switch and the second switch based on a power generation state of the photovoltaic system.

The instruction to change the ground structure includes an instruction to, upon the photovoltaic system operating in the power generating state, operate the first switch and the second switch in a closed state to apply a grounding ground structure to the photovoltaic system and the power conversion system so that the first ground fault detector detects whether a ground fault occurs in the photovoltaic system and the power conversion system.

The instruction to change the ground structure may include an instruction to, upon the photovoltaic system switching from a non-power generating state to the power generating state, operate the second switch in an open state for a predetermined time to apply a floating ground structure to the photovoltaic system and the power conversion system so that a second ground fault detector located at a DC link input node of the power conversion system detects whether the ground fault occurs in the photovoltaic system and the power conversion system.

The instruction to change the ground structure may include an instruction to, upon the photovoltaic system being in a non-power generating state, operate the first switch in an open state and the second switch in a closed state to apply a grounding ground structure to the photovoltaic system so that the first ground fault detector detects whether a ground fault occurs in the photovoltaic system.

The instruction to change the ground structure may include an instruction to apply a floating ground structure to the power conversion system and control a second ground fault detector located at a direct current (DC) link input node of the power conversion system to detect whether the ground fault occurs in the power conversion system.

According to embodiments of the present disclosure, it is possible to prevent a decrease in efficiency of the photovoltaic system by minimizing PID generated in the photovoltaic system.

In addition, it is possible to monitor a ground fault of a DC-Coupled energy storage system linked to the photovoltaic system, and efficiency and safety can be secured at the same time compared to existing technologies.

BRIEF DESCRIPTION OF THE DRAWINGS

FIG. 1 is a block diagram of an example of a DC-coupled energy storage system linked to a PV system to which the present invention may be applied.

FIG. 2A is a configuration diagram of a DC-Coupled energy storage system linked to a PV system having a typical floating ground structure.

FIG. 2B is a conceptual diagram illustrating an operating method of a DC-Coupled energy storage system linked to a PV system having a typical floating ground structure.

FIG. 3A is a configuration diagram of a DC-Coupled energy storage system linked to a PV system having a typical grounding ground structure.

FIG. 3B is a conceptual diagram illustrating an operating method of a DC-Coupled energy storage system linked to a PV system having a typical grounding ground structure.

FIG. 4 is a configuration example of an energy storage system having a ground structure according to embodiments of the present invention.

FIG. 5 is a conceptual diagram illustrating an exemplary operating method of an energy storage system having a ground structure according to embodiments of the present invention.

FIG. 6 is a conceptual diagram illustrating another exemplary operating method of an energy storage system having a ground structure according to embodiments of the present invention.

FIG. 7 is a circuit diagram illustrating a switch controller according to an embodiment of the present invention.

FIG. 8 is a circuit diagram illustrating an apparatus for controlling ground configuration including a switch controller according to embodiments of the present invention.

FIG. 9 is a circuit diagram showing a PV system connection terminal of the apparatus for controlling ground configuration according to embodiments of the present invention.

FIG. 10 is a circuit diagram showing a battery system connection terminal of the apparatus for controlling ground configuration according to embodiments of the present invention.

FIG. 11 is a block diagram of a switch control apparatus according to another embodiment of the present invention.

DETAILED DESCRIPTION OF THE EMBODIMENTS

The present invention may be modified in various forms and have various embodiments, and specific embodiments thereof are shown by way of example in the drawings and will be described in detail below. It should be understood, however, that there is no intent to limit the present invention to the specific embodiments, but on the contrary, the present invention is to cover all modifications, equivalents, and alternatives falling within the spirit and technical scope of the present invention. Like reference numerals refer to like elements throughout the description of the figures.

It will be understood that, although the terms such as first, second, A, B, and the like may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes combinations of a plurality of associated listed items or any of the plurality of associated listed items.

It will be understood that when an element is referred to as being "coupled" or "connected" to another element, it can be directly coupled or connected to the other element or an intervening element may be present. In contrast, when an element is referred to as being "directly coupled" or "directly connected" to another element, there is no intervening element present.

The terms used herein is for the purpose of describing specific embodiments only and are not intended to limit the present invention. As used herein, the singular forms "a", "an" and "the" are intended to include the plural forms as well, unless the context clearly indicates otherwise. It will be further understood that the terms "comprises", "comprising", "includes", "including" and/or "having", when used herein, specify the presence of stated features, integers, steps, operations, constitutional elements, components and/or combinations thereof, but do not preclude the presence or addition of one or more other features, integers, steps, operations, constitutional elements, components, and/or combinations thereof.

Unless otherwise defined, all terms used herein, including technical and scientific terms, have the same meanings as commonly understood by one skilled in the art to which the present invention belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

Some terms used herein are defined as follows.

A nominal capacity (Nominal Capa.) refers to a capacity [Ah] of a battery set during development by a battery manufacturer.

State of Charge (SOC) refers to a current state of charge of a battery, represented in percent points [%], and State of Health (SOH) may be a current condition of a battery compared to its ideal or original conditions, represented in percent points [%].

A battery rack refers to a system of a minimum single structure assembled by connecting modules set by a battery manufacturer in series/parallel, which can be monitored and controlled by a battery management system (BMS). A battery rack may include several battery modules and a battery protection unit or any other protection device.

A battery bank refers to a group of large-scale battery rack systems configured by connecting several racks in parallel. A bank BMS for a battery bank may monitor and control several rack BMSs, each of which manages a battery rack.

A battery section controller (BSC) refers to a device that controls the topmost level of a battery system including a battery bank level structure or a multiple bank level structure.

A power limit refers to a limit of power that can be output from a battery, which is set in advance by a battery manufacturer based on a battery condition. A rack power limit may mean an output power limit ([kW]) set for a rack level, and can be set based on a SOC and a temperature of the battery.

The power limit can be a charge power limit or a discharge power limit depending on whether charging or discharging is applied. In addition, according to a battery system structure, a rack power limit or a bank power limit may be defined.

Hereinafter, exemplary embodiments of the present invention will be described in detail with reference to the accompanying drawings.

FIG. 1 is a block diagram of an example of a DC-coupled energy storage system linked to a PV system to which the present invention may be applied.

In a DC-coupled energy storage system, a DC/DC converter 500 capable of individually controlling DC voltage/current for each battery system 100 is needed. Since a DC/DC converter is placed in the battery system, not only protection control of the battery system is possible through a DC/DC converter for each battery system, as in an existing energy storage system, but also, it is possible to control amount of battery power based on characteristics of individual battery systems even when battery racks have differences in SOC, SOH, and capacity.

FIG. 1 shows an example of a DC coupled system in which an output terminal of a photovoltaic (PV) 700 is connected to an output terminal of a DC/DC converter 500 and an input terminal of a PCS 400.

In an energy storage system (ESS), a battery is used for storing energy or power and multiple battery modules may typically form a battery rack and multiple battery racks form a battery bank. Here, depending on a device or a system in which the battery is used, a battery rack may be referred to as a battery pack. Battery #1, battery #2, . . . , and battery #N shown in FIG. 1 may be a battery pack or a battery rack.

Here, a battery management system (BMS) 100 may be installed for each battery. The BMS 100 may monitor a current, a voltage and a temperature of each battery pack (or rack) to be managed, calculate a State Of Charge (SOC) of the battery based on a monitoring result to control charging and discharging. In the system of FIG. 1, in case that each battery is a battery rack, the BMS may be a rack BMS (RBMS).

A battery section controller (BSC) 200 may be located in each battery section which includes a plurality of batteries, peripheral circuits, and devices to monitor and control objects such as a voltage, a current, a temperature, and a circuit breaker.

In addition, a power conversion/conditioning system (PCS) 400 installed in each battery section may control power supplied from the outside and power supplied from the battery section to the outside and may include a DC/AC inverter. The output of the DC/DC converter 500 may be connected to the PCS 400 and the PCS 400 may be connected to the power grid 600. Here, the PCS 400 typically operates in a constant power mode. A power management system (PMS)/Energy Management System (EMS) 300 connected to the PCS may control the output of the PCS based on the monitoring and control results of the battery management system or the battery section controller.

In the energy storage system of FIG. 1, battery #1 is connected to DC/DC converter #1, battery #2 is connected to DC/DC converter #2, and battery #N is connected to DC/DC #N. The output of the DC/DC converter corresponding to each battery is connected to the PCS 400 through a DC link.

The DC/DC converter may be a bidirectional converter, wherein when conversion is performed from the battery to the load direction, the input of the DC/DC converter is connected to a battery (a battery unit, a battery rack or a battery pack) and the output of the DC/DC converter may be connected to a load. As examples of the DC/DC converter, various types of converters such as a full-bridge converter, a half-bridge converter, and a flyback converter may be used.

Meanwhile, communication among the BMS, the BSC 200, the PMS 300, and the PCS 400 may be implemented through a controller area network (CAN) or Ethernet (indicated by a dotted line in FIG. 1).

According to an embodiment of the present invention shown in FIG. 1, the BSC 200 in charge of overall control of the battery area may report a state of each battery to the PMS 300. Here, the state of each battery may include information such as a state of charge (SOC), a state of health (SOH), a voltage, and a temperature of each battery. The BSC 200 may provide information such as limit power (P_battery_limit) and real power (P_battery_real) of each battery to the power management system 300. The power management system 300 in charge of controlling the entire ESS system may issue a charge command or a discharge command (via P pcs reference) to the power conversion system 400 during system operation.

Here, the BSC 200 determines an output reference for each DC/DC converter based on a state of each battery. In an embodiment according to the present invention, an output reference of an individual DC/DC converter may be set in different ways according to a droop mode or a constant power (CP) mode.

When the output of the DC/DC converter is controlled according to the droop mode, the BSC may set a droop curve for each DC/DC converter in consideration of the state of each battery before operating the system and provide the set droop curve to the converter. Meanwhile, when the DC/DC converter operates in the CP mode, a power reference of each DC/DC converter may be determined during system operation and provided to a corresponding converter.

During actual operation of the energy storage system, the power management system delivers charge/discharge commands to the power conversion system and the battery section controller. Here, the power management system may monitor states of the photovoltaic system (PV), the grid, and the battery in real time, and decide operation modes and output references of respective components in the system based on operation commands received from an upper system, e.g., Energy Management System (EMS).

Meanwhile, although a system in which a respective DC/DC converter is applied to each battery rack is exemplified in FIG. 1, the present invention may also be applied to a system in which a central DC/DC converter commonly connected to a plurality of battery racks.

In the DC coupled energy storage system as shown in FIG. 1, a ground structure is determined depending on whether a negative power line of the PV system is grounded. In addition, a ground fault monitoring method differs depending on the ground structure, and an aftermath of the accident also appears in a different form depending on the ground structure.

A system structure as to grounding may be divided into a grounding (grounding ground) system and an ungrounding (floating ground) system. The grounding system may cause equipment damage due to a flow of fault current when a 1-wire ground fault occurs. On the other hand, in the ungrounding system, fault current does not occur when a 1-wire ground fault occurs, and current flows only when a ground fault occurs again.

FIG. 2A is a configuration diagram of a DC-Coupled energy storage system linked to a PV system having a typical floating ground structure.

The energy storage system in FIG. 2A includes a battery system 10, a DC/DC converter 50, a PV system 70, and a power conversion system 40 interconnected with them, and has a floating ground structure. In general, in battery systems, a floating ground (or ungrounding) structure is recommended to ensure safety in the event of a ground fault.

The connection between the PV system 70 and the power conversion system 40 may be controlled through switch 1 (SW1), and the PV system 70 is usually disconnected from the DC link at night. The connection between the battery system 10 including a DC/DC converter 50 and the power conversion system 40 is made through switch 2 (SW2), and the connection is usually maintained as ON state when the system operates normally.

In the system structure of FIG. 2A, both the positive terminals and negative terminals of the PV system and battery system are not connected to the ground. Like this, a ground structure in which positive and negative terminals of the power line are not connected to the ground is referred to as a floating ground (or ungrounding). In order to monitor ground faults in this system structure, insulation resistance and ground faults can be monitored using an insulation monitoring device such as an insulation monitoring device (IMD). The IMD is a device for measuring and monitoring insulation resistance values between a positive terminal and the ground and between a negative terminal and the ground, and may be located on a DC power line of the power conversion system 40 as shown in FIG. 2A.

The IMD, a ground fault monitoring device, detects insulation resistance and ground faults according to an open/close state of switch 1, but however, in this structure, limitations as described below may occur.

FIG. 2B is a conceptual diagram illustrating an operating method of a DC-Coupled energy storage system linked to a PV system having a typical floating ground structure.

FIG. 2B shows states of respective components (a power conversion system (PCS), a PV system, a battery system) according to operating states of the energy storage system having a floating ground structure. When the system is charging, switch 1 is closed and the PV system is connected to the battery system and the power grid. Here, the power conversion system 40, the PV system 70, and the battery system 10 are all in a floating ground state, and insulation resistance can be measured by the IMD, so that a ground fault can be monitored.

However, when switch 1 is opened to separate the PV system from the DC link at night, a ground fault occurring within the PV system cannot be detected. In addition, a Potential Induced Degradation (PID) may occur in a solar cell in the PV system with a floating ground, resulting in gradual system deterioration. As the deterioration progresses, the amount of energy generated by the solar cell decreases, and thus, system efficiency decreases.

For this reason, negative grounding is mainly used to prevent Potential Induced Degradation (PID), which adversely affects power generation efficiency, from occurring in a PV system.

FIG. 3A is a configuration diagram of a DC-Coupled energy storage system linked to a PV system having a typical grounding ground structure.

The energy storage system of FIG. 3A includes a battery system 10, a DC/DC converter 50, a PV system 70, and a power conversion system 40 interconnected with them, and has a negative grounding ground structure among 1-pole grounding ground structures. The negative grounding ground structure represents a structure in which a negative (−) terminal of a power line is connected to the ground. In FIG. 3A, the negative terminal of the PV system and the negative terminal of the battery system are connected to the ground through a switch.

The connection between the PV system 70 and the power conversion system 40 may be controlled through switch 1 (SW1), and the PV system 70 is typically disconnected from the DC link at night. The connection between the battery system 10 including the DC/DC converter 50 and the power conversion system 40 is made through switch 2 (SW2), and the connection is usually maintained in an ON state when the system operates normally. Additionally, in the system of FIG. 3A, the negative terminals of the battery system and the PV system are selectively connected to the ground through switch 3 (SW3).

In this system structure, insulation resistance and ground faults can be monitored using insulation and ground fault monitoring devices such as IMD, Residential Current Monitoring (RCM) device, and Ground Fault Detection Interrupter (GFDI) to monitor ground faults.

The IMD is a device that measures and monitors a insulation resistance value between a positive terminal and the ground and between a negative terminal and the ground. The IMD may be located, as shown in FIG. 3A, on the DC power line of the power conversion system 40 or between the battery rack and the DC/DC converter. The RCM is a device for detecting leakage current by monitoring whether a sum of currents flowing through each of the positive power line and the negative power line is 0, and is located between the battery rack and the DC/DC converter in FIG. 3A. In addition, the GFDI is a device connected between the power line and the ground, and is a device that blocks a current when the current flowing from the power line to the ground exceeds a reference value.

Meanwhile, even in such a negative grounding ground structure, limitations as described below may occur.

FIG. 3B is a conceptual diagram illustrating an operating method of a DC-Coupled energy storage system linked to a PV system having a typical grounding ground structure.

FIG. 3B shows states of respective components (a power conversion system (PCS), a PV system, a battery system) according to operating states of the energy storage system having a grounding ground structure. Here, switch 1 is in a closed state when the battery is charging or when the battery is in a resting state after charging, and the PV system is connected to the battery system and the power grid. Here, switch 3 is also in a closed state, and the negative terminals of the power conversion system 40, the PV system 70, and the battery system 10 are grounded. If a ground fault occurs in this situation, a fault current is generated.

Thereafter, after power generation of the PV system is terminated, switch 1 and switch 3 are opened so that the power conversion system 40, the PV system 70, and the battery system 10 are all in a floating ground state. Here, since the PV system 70 is in a floating ground state, a PID occurs and thus, PV power generation efficiency is eventually reduced. In addition, insulation reduction and ground fault cannot be detected due to the opening of switch 1.

Therefore, which method of grounding to use in an energy storage system including a PV system and a battery system becomes a matter of selection between system efficiency and safety. Ultimately, system efficiency and safety are in a trade-off relationship and determined by a system designer's choice, thereby a problem arising no matter which one is selected.

In order to solve this problem, the present invention aims to secure both the stability and efficiency of a DC-coupled energy storage system linked to a PV system by operating the energy storage system through changing grounding modes according to a power generation state of the photovoltaic system.

FIG. 4 is a configuration example of an energy storage system having a ground structure according to embodiments of the present invention.

The energy storage system according to embodiments of the present invention may include a PV system 700 and a power conversion system 400 interworking with the PV system, and may further include a battery system 100 and a DC/DC converter 500.

The connection between the PV system 700 and the power conversion system 400 is controlled through a first switch S1. A first ground fault detector may be located between the first switch and the PV system (including a plurality of PV panels) for detecting a ground fault. Here, the first ground fault detector may include a Ground Fault Detection Interrupter (GFDI).

One terminal of the first ground fault detector (GFDI) may be connected to the ground, and the other terminal may be connected to a node on a negative power line between the PV system and the first switch. Here, the connection between the first ground fault detector (GFDI) and the negative power line may be controlled through a second switch S2.

A second ground fault detector may be configured as a device for monitoring or detecting a ground fault at a DC link input node of the power conversion system 400. Here, the second ground fault detector may include an Insulation Monitoring Device (IMD).

The battery system 100 including the DC/DC converter 500 may be connected to a DC link input node of the power conversion system 400. Here, the connection between the battery system 100 including the DC/DC converter 500 and the power conversion system 400 can be controlled through a third switch S3, and is usually maintained as closed when the system operates normally.

In the present invention, the DC/DC converter 500 may be in a form of rack DC/DC converters as shown in FIG. 4 and may also be in a form of a central DC/DC converter commonly connected to a plurality of battery racks.

An energy storage system according to embodiments of the present invention may include a switch controller for controlling one or more of the first to third switches. Here, the switch controller may control one or more of the first to third switches to change a ground structure of one or more of the PV system 700, the battery system 100, and the power conversion system 400, and the PV system 700 and a DC link of the power conversion system 400 may be selectively connected.

Hereinafter, with reference to FIGS. 5 and 6, an operating method of an energy storage system according to embodiments of the present invention will be described in detail.

FIG. 5 is a conceptual diagram illustrating an exemplary operating method of an energy storage system having a ground structure according to embodiments of the present invention.

As shown in FIG. 5, the switch controller may control a first switch and a second switch according to a power generation state of a PV system 700, thereby changing a grounding structure of at least one of a PV system 700, a battery system 100, and a power conversion system (PCS) 400. Here, a third switch is maintained in a closed state regardless of the power generation state of the PV system.

According to an operating method of the energy storage system shown in FIG. 5, the PV system 700 is operated in a grounding structure except for a certain time td immediately after switching to a power generating state, and the battery system 100 and the power conversion system 400 are operated in a floating ground structure except for a power generating state of the PV system 700.

Specifically, when the PV system 700 is in a non-power generating state (e.g., night time), the first switch is operated in an open state and the second switch is operated in a closed state so that the PV system 700 is operated in a grounding ground structure and the battery system 100 and the power conversion system 400 are operated in a floating ground structure. Here, the PV system 700 may detect a ground fault using a first ground fault detector (GFDI) located between the first switch and the PV system 700. In addition, the battery system 100 and the power conversion system 400 may detect whether or not a ground fault occurs using a second ground fault detector (IMD) located at a DC link input node of the power conversion system 400.

When the PV system 700 is in a power generating state (e.g., daytime), the first switch and the second switch are operated in a closed state, so that the PV system 700, all of the battery system 100, and the power conversion system 400 are operated as a grounding ground structure. Here, the first ground fault detector (GFDI) may detect whether a ground fault occurs in the PV system 700, the battery system 100, and the power conversion system 400.

Here, the second switch may operate in an open state (while the first switch operates in a closed state) for a predetermined time period (td) after the PV system 700 is switched from a non-power generating state to a power generating state. Accordingly, during the corresponding time period td, the PV system 700, the battery system 100, and the power conversion system 400 may all operate in a floating ground structure. Here, the second ground fault detector (IMD) may detect whether a ground fault occurs in the PV system 700, the battery system 100, and the power conversion system 400. In other words, the energy storage system may be temporarily switched to a floating ground structure immediately after the PV system 700 is switched from a non-power generating state to a power generating state, and monitor insulation states of all components (100, 400, and 700) through the IMD. Here, if an abnormality occurs in insulation state and the system is shut down, additional actions may be taken to confirm and resolve the abnormality, such as on-site inspection, and if there is no abnormality, the energy storage system may be switched to and operated in a grounding structure.

According to embodiments of the present invention, as the PV system 700 is operated in a grounding ground structure except for a certain time td immediately after switching to a power generating state, PID generation of the PV system 700 can be minimized, thereby preventing efficiency decrease.

In addition, since the battery system 100 is operated in a floating ground structure except for a power generating state of the PV system 700, a possibility of fault current flowing in the event of a ground fault can be minimized and thus, system safety can be secured.

FIG. 6 is a conceptual diagram illustrating another exemplary operating method of an energy storage system having a ground structure according to embodiments of the present invention. Here, the operating method shown in FIG. 6 represents an operating method when a temporary non-power generating state of the PV system 700 occurs.

Specifically, when the PV system 700 is in a non-power generating state (e.g., night time), the first switch is operated in an open state and the second switch is operated in a closed state, so that the PV system 700 operates in a grounding ground structure whereas the battery system 100 and the power conversion system 400 operate in a floating ground structure. Here, the PV system 700 may use the first ground fault detector (GFDI) to detect whether a ground fault occurs whereas the battery system 100 and the power conversion system 400 may use the second ground fault detector (IMD) to determine whether a ground fault occurs.

For a predetermined time period (td) after the PV system 700 is switched from a non-power generating state to a power generating state (e.g., day time), the first switch is operated in a closed state and the second switch is operated in an open state, and thus, the PV system 700, the battery system 100, and the power conversion system 400 may all be operated in a floating ground structure during the corresponding time td. Here, the second ground fault detector (IMD) may detect whether a ground fault occurs in the PV system 700, the battery system 100, and the power conversion system 400.

In case that no abnormality occurs in insulation states of all components (100, 400, 700), the first switch and the second switch are operated in a closed state, so that the PV system 700, the battery system 100, and the power conversion system 400 are all operated in a grounding ground structure. Here, the first ground fault detector (GFDI) may detect whether a ground fault occurs in the PV system 700, the battery system 100, and the power conversion system 400.

Somehow, when the PV system 700 is switched from a power generating state to a temporary non-power generating state (e.g., a non-power generating state due to weather conditions such as clouds or rain), the first switch operates in an open state and the second switch operates in a closed state, and thus, the PV system 700 operates in a grounding ground structure whereas the battery system 100 and the power conversion system 400 operates in a floating ground structure. Here, the PV system 700 may use the first ground fault detector (GFDI) to detect a ground fault occurrence whereas the battery system 100 and the power conversion system 400 may use the second ground fault detector (IMD) to detect a ground fault occurrence.

Thereafter, when the PV system 700 is switched from a temporary non-power generating state to a power generating state, the first switch and the second switch are operated in a closed state, so that the PV system 700, the battery system 100, and the power conversion system 400 are all operated with a grounding ground structure. In other words, when the temporary non-power generating state is released, the preliminary monitoring process, which is performed when a switching from a non-power generating state to a power generating state using the second ground fault detector (IMD), may be omitted.

According to the embodiment, similar to the operating method shown in FIG. 5, the PV system 700 may be operated in a grounding structure except for a certain time td immediately after switching to a power generating state, whereas the battery system 100 may be operated in a floating ground structure except for a power generation state of the PV system 700, and thus, it is possible to minimize occurrence of PID of the PV system 700 and ensure system safety.

In addition, a preliminary monitoring process through the second ground fault detector (IMD) is performed when it is switched from a non-power generating state to a power generating state, but however, the preliminary monitoring process is omitted when it is switched from the temporary non-power generating state to a power generating state, thereby improving the operational efficiency of the energy storage system.

Hereinafter, with reference to FIGS. 7 to 10, a switch controller implemented as a circuit and a ground structure control apparatus including the same will be described.

FIG. 7 is a circuit diagram illustrating a switch controller according to an embodiment of the present invention.

The switch controller may control the first switch and the second switch according to a power generating state of the PV system 700 to change a grounding structure of one or more of the PV system 700, the battery system 100, and the power conversion system 400 and selectively connect the PV system 700 and a direct current (DC) link of the power conversion system 400.

The switch controller may include a first switch driving circuit configured to drive a first switch and a second switch driving circuit configured to drive a second switch. Here, the first and second switch driving circuits may include a device for converting open/closed states of each switch, and may include one or more of a power supply device, a switch driving device, and a logic circuit.

The first switch driving circuit may be configured to receive power generated by the PV system 700 and drive the first switch. As shown in FIG. 7, the first switch driving circuit may include a power supply device (e.g., Switched Mode Power Supply: SMPS) connected to an output terminal of the PV system 700 and a switch driving device for switching states of the first switch using power supplied from the power supply device (SMPS).

Here, the first switch may be configured as a normally open switch. Here, the first switch driving circuit may operate the first switch in an open state if power is not supplied when the PV system 700 is in a non-power generating state, and turn the first switch into a closed state if power is supplied when the PV system 700 is in a power generating state.

The second switch driving circuit may be configured to receive power generated by the PV system 700 to drive the second switch, and to drive the second switch with the supplied power when a control signal is received from an external control device. As shown in FIG. 7, the second switch driving circuit may include a power supply device (SMPS) connected to an output terminal of the PV system 700, an AND circuit which outputs power supplied by from power supply device (SMPS) to the outside in the instance that a control signal (S2 control signal from external) is received from an external control device, and a switch driving device which switches a state of the second switch using power supplied from an output terminal of the AND circuit.

Here, the second switch may be configured as a normally closed switch. In addition, the second switch driving circuit operates the second switch in a closed state because power is not supplied when the PV system 700 is in a non-power generation state, and, if the PV system 700 is in a power generation state, the second switch may be switched to an open state upon power being supplied only when an external control signal power is received.

FIG. 8 is a circuit diagram illustrating an apparatus for controlling ground configuration including a switch controller according to embodiments of the present invention.

The apparatus for controlling ground configuration according to embodiments of the present invention may be electrically connected to the photovoltaic system 700, the battery system 100, and the power conversion system 400, and change a ground structure of at least one of the photovoltaic system, the power conversion system, and a battery system based on a power generation state of the photovoltaic system. Here, the apparatus for controlling ground configuration (indicated by a dotted line box in FIG. 8) may be implemented as a PV-ESS coupling box including a first switch, a second switch, a third switch, first and second ground fault detectors, and a switch controller.

In FIG. 8, the first switch S1 may be configured as a normally open switch, the second switch S2 may be configured as a normally closed switch, and the third switch S3 may be configured as a manually opened/closed switch (e.g., disconnector).

The switch controller may include a first switch driving circuit configured to drive the first switch and a second switch driving circuit configured to drive the second switch. Here, the first switch driving circuit may receive power produced by the PV system 700 and be configured to drive the first switch, and the second switch driving circuit may be supplied with power produced by the PV system 700 to drive the second switch and drive the second switch with the supplied power when a control signal is received from an external control device.

An operating method of the energy storage system according an apparatus for controlling ground configuration shown in FIG. 8 is as follows.

When the PV system 700 is in a non-power generating state (e.g., night time), power is not supplied to the first and second switch driving circuits, so that the first switch is operated in an open state and the second switch is operated in a closed state. Accordingly, the PV system 700 is operated in a grounding ground structure whereas the battery system 100 and the power conversion system 400 are operated in a floating ground structure.

When the PV system 700 is switched from a non-power generating state to a power generating state (e.g., daytime), a control signal (S2 control signal from external) for switching the second switch to an open state is input for a predetermined time (td). Here, the control signal may be set to be input by a manager or input when a power generating state is detected. Here, when power is supplied to the first and second switch driving circuits and an external control signal is input, the first switch is switched to a closed state and the second switch is switched to an open state. Accordingly, during a corresponding time period td, the PV system 700, the battery system 100, and the power conversion system 400 may all operate in a floating ground structure. Here, the second ground fault detector (IMD) may detect whether a ground fault occurs in the PV system 700, the battery system 100, and the power conversion system 400.

After the corresponding time td has elapsed, the second switch is switched to a closed state, and the PV system 700, the battery system 100, and the power conversion system 400 are all operated in a grounding ground structure.

Here, when the PV system 700 is switched from a power generating state to a temporary non-power generating state (e.g., a non-power generating state due to weather conditions such as clouds, rain), power is not supplied to the first and second switch driving circuits, the first switch is switched to an open state, and the second switch maintains in a closed state. Accordingly, the PV system 700 is operated in a grounding ground structure, and the battery system 100 and the power conversion system 400 are operated in a floating ground structure.

Thereafter, when the PV system 700 is switched from a temporary non-power generating state to a power generating state, power is supplied to the first and second switch driving circuits, but an external control signal is not input, so that the first switch is switched to a closed state and the second switch maintains its closed state. Accordingly, the PV system 700, the battery system 100, and the power conversion system 400 are all operated in a grounding ground structure.

FIG. 9 is a circuit diagram showing a PV system connection terminal of the apparatus for controlling ground configuration according to embodiments of the present invention.

An apparatus for controlling a ground structure according to embodiments of the present invention may be implemented as a PV-ESS coupling box, and DC input ports for electrically connecting to the PV system 700 may be provided outside the coupling box.

The DC input ports may include positive input ports connected to respective positive terminals of the plurality of PV modules (PV1, PV2, . . . ) and negative input ports connected to respective negative terminals of the plurality of PV modules (PV1, PV2, . . . ). Here, each of the positive input ports and the negative input ports may be electrically coupled inside the PV-ESS coupling box.

A fuse for protection may be provided on a path where the apparatus for controlling ground configuration and the PV system 700 are electrically connected.

FIG. 10 is a circuit diagram showing a battery system connection terminal of the apparatus for controlling ground configuration according to embodiments of the present invention.

The apparatus for controlling a ground structure according to embodiments of the present invention may be implemented as a PV-ESS coupling box, and DC input ports for electrically connecting with the battery system 100 including the DC/DC converter 500 may be provided outside the coupling box.

The DC input ports may include positive input ports connected to respective positive terminals of the plurality of DC/DC converters 500 (DC/DC #1, DC/DC #2, . . . ), and negative input ports connected to respective negative terminals of the plurality of DC/DC converters 500 (DC/DC #1, DC/DC #2, . . . ). Here, each of the positive input ports and the negative input ports may be electrically coupled inside the PV-ESS coupling box and connected to the third switch.

A fuse for protection and a surge protection device may be provided on a path where the apparatus for controlling ground configuration and the battery system 100 including the DC/DC converter 500 are electrically connected.

FIG. 11 is a block diagram of a switch control apparatus according to another embodiment of the present invention.

Referring to FIG. 11, the switch control apparatus may be implemented as a computing device, unlike the switch controller implemented as the circuit shown in FIG. 7.

The switch control apparatus 300 according to an embodiment of the present invention may be a power management system (PMS) or an energy management system (EMS) included in the energy storage system, but may also be any type of control device located in or interlocking with the energy storage system. Here, the energy storage system may include a photovoltaic (PV) system, a battery system, and a power conversion system (PCS) selectively connected to at least one of the photovoltaic system and the battery system, and interconnected with the power grid.

The switch control apparatus 300 may include at least one processor 310, a memory 320 for storing at least one command executed by the processor, and a transceiver 330 connected to a network to perform communication.

The at least one instruction may include an instruction to check a state of the photovoltaic system and an instruction to change a ground structure of at least one of the photovoltaic system, the power conversion system, and a battery system included in the energy storage system by controlling the first switch and the second switch based on a power generation state of the photovoltaic system.

The instruction to change a ground structure includes an instruction to, upon the photovoltaic system operating in a power generating state, operate the first switch and the second switch in a closed state to apply a grounding ground structure to the photovoltaic system and the power conversion system so that the first ground fault detector detects whether a ground fault occurs in the photovoltaic system and the power conversion system.

The instruction to change a ground structure may include an instruction to, upon the photovoltaic system switching from a non-power generating state to a power generating state, operate the second switch in an open state for a predetermined time to apply a floating ground structure to the photovoltaic system and the power conversion system so that the second ground fault detector located at the DC link input node of the power conversion system detects whether a ground fault occurs in the photovoltaic system and the power conversion system.

The instruction to change a ground structure may include an instruction to, upon the photovoltaic system switching being in a non-power generating state, operate the first switch in an open state and the second switch in a closed state to apply a grounding ground structure to the photovoltaic system so that the first ground fault detector detects whether a ground fault occurs in the photovoltaic system.

The instruction to change a ground structure may include an instruction to apply a floating ground structure to the power conversion system and control a second ground fault detector located at a direct current (DC) link input node of the power conversion system to detect whether a ground fault occurs in the power conversion system.

The switch control apparatus 300 of the energy storage system may further include an input interface 340, an output interface 350, a storage device 360, and the like. Respective components included in the switch control apparatus 300 may be connected by a bus 370 to communicate with each other.

The processor 310 may execute a program command stored in at least one of the memory 320 and the storage device 360. Here, the processor may mean a central processing unit (CPU), a graphics processing unit (GPU), or a dedicated processor on which methods according to embodiments of the present invention are performed. The memory (or storage device) may comprise at least one of a volatile storage medium and a non-volatile storage medium. For example, the memory may include at least one of read only memory (ROM) and random access memory (RAM).

The operations of the method according to the embodiments of the present invention may be implemented as a computer-readable program or code on a computer-readable recording medium. The computer-readable recording medium includes all types of recording devices in which data readable by a computer system is stored. In addition, the computer-readable recording medium may be distributed in a network-connected computer system to store and execute computer-readable programs or codes in a distributed manner.

Although some aspects of the invention have been described in the context of the apparatus, it may also represent a description according to a corresponding method, wherein a block or apparatus corresponds to a method step or feature of a method step. Similarly, aspects described in the context of a method may also represent a feature of a corresponding block or item or a corresponding apparatus. Some or all of the method steps may be performed by (or using) a hardware device, such as, for example, a microprocessor, a programmable computer, or an electronic circuit. In some embodiments, one or more of the most important method steps may be performed by such an apparatus.

In the foregoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. An energy storage system connected with a power grid, the energy storage system comprising:
    a photovoltaic (PV) system;
    a power conversion system (PCS) configured to be connected with the power grid and selectively connected to the photovoltaic system;
    a first switch configured to selectively connect the photovoltaic system and a direct current (DC) link of the power conversion system;
    a first ground fault detector including a terminal which is connected to a ground;
    a second switch selectively configured to connect the photovoltaic system and another terminal of the first ground fault detector, wherein the second switch is located between the first switch and the photovoltaic system; and
    a switch controller configured to change a ground structure of at least one of the photovoltaic system, the power conversion system, and a battery system included in the energy storage system and to selectively connect the photovoltaic system and the DC link of the power conversion system, by controlling the first switch and the second switch based on a power generation state of the photovoltaic system.

2. The energy storage system of claim 1, wherein the switch controller is further configured to:
    upon the photovoltaic system operating in the power generating state,
    operate the first switch and the second switch in a closed state to apply a grounding ground structure to the photovoltaic system and the power conversion system so that the first ground fault detector detects whether a ground fault occurs in the photovoltaic system and the power conversion system.

3. The energy storage system of claim 2, wherein the switch controller is further configured to:
    upon the photovoltaic system switching from a non-power generating state-to-a to the power generating state,
    operate the second switch in an open state for a predetermined time to apply a floating ground structure to the photovoltaic system and the power conversion system so that a second ground fault detector located at a DC link input node of the power conversion system detects whether the ground fault occurs in the photovoltaic system and the power conversion system.

4. The energy storage system of claim 1, wherein the switch controller is further configured to:
upon the photovoltaic system being in a non-power generating state,
operate the first switch in an open state and the second switch in a closed state to apply a grounding ground structure to the photovoltaic system and a floating ground structure to the power conversion system so that the first ground fault detector detects whether a ground fault occurs in the photovoltaic system.

5. The energy storage system of claim 4, further comprising a second ground fault detector located at a direct current (DC) link input node of the power conversion system,
wherein the second ground fault detector is configured to detect whether the ground fault occurs in the power conversion system.

6. The energy storage system of claim 1, wherein the first switch operates as a normally open switch,
wherein the switch controller includes a first switch driving circuit configured to drive the first switch by receiving power generated by the photovoltaic system, and
wherein the switch controller operates the first switch in a closed state in an instance that the photovoltaic system is in a power generating state.

7. The energy storage system of claim 1, wherein the second switch operates as a normally closed switch, and
wherein the switch controller includes a second switch driving circuit configured to drive the second switch by receiving power generated by the photovoltaic system.

8. The energy storage system of claim 7, wherein the second switch driving circuit is configured to be driven by the power when a control signal is received from an external control device and to open the second switch in an instance that the photovoltaic system is in the power generating state and the control signal is input.

9. The energy storage system of claim 1, further comprising the battery system connected to a DC link input node of the power conversion system.

10. The energy storage system of claim 1, wherein the first ground fault detector includes a ground fault detection interrupter (GFDI).

11. The energy storage system of claim 3, wherein the second ground fault detector includes an insulation monitoring device (IMD).

12. An apparatus for controlling a ground configuration of an energy storage system which is connected to a power grid, the energy storage system including a photovoltaic (PV) system and a power conversion system (PCS) selectively connected to the photovoltaic system, the apparatus comprising:
a first switch configured to selectively connect the photovoltaic system and a direct current (DC) link of the power conversion system;
a first ground fault detector including a terminal which is connected to a ground;
a second switch selectively configured to connect the photovoltaic system and another terminal of the first ground fault detector, wherein the second switch is located between the first switch and the photovoltaic system; and
a switch controller configured to change a ground structure of at least one of the photovoltaic system, the power conversion system, and a battery system included in the energy storage system and to selectively connect the photovoltaic system and the DC link of the power conversion system, by controlling the first switch and the second switch based on a power generation state of the photovoltaic system.

13. The apparatus of claim 12, wherein the switch controller is further configured to:
upon the photovoltaic system operating in the power generating state,
operate the first switch and the second switch in a closed state to apply a grounding ground structure to the photovoltaic system and the power conversion system so that the first ground fault detector detects whether a ground fault occurs in the photovoltaic system and the power conversion system.

14. The apparatus of claim 13, wherein the switch controller is further configured to:
upon the photovoltaic system switching from a non-power generating state to the power generating state,
operate the second switch in an open state for a predetermined time to apply a floating ground structure to the photovoltaic system and the power conversion system so that a second ground fault detector located at a DC link input node of the power conversion system detects whether the ground fault occurs in the photovoltaic system and the power conversion system.

15. The apparatus of claim 12, wherein the switch controller is further configured to:
upon the photovoltaic system being in a non-power generating state,
operate the first switch in an open state and the second switch in a closed state to apply a grounding ground structure to the photovoltaic system and a floating ground structure to the power conversion system so that the first ground fault detector detects whether a ground fault occurs in the photovoltaic system.

16. The apparatus of claim 15, further comprising a second ground fault detector located at a direct current (DC) link input node of the power conversion system,
wherein the second ground fault detector is configured to detect whether the ground fault occurs in the power conversion system.

17. The apparatus of claim 12, wherein the first switch operates as a normally open switch,
wherein the switch controller includes a first switch driving circuit configured to drive the first switch by receiving power generated by the photovoltaic system, and
wherein the switch controller operates the first switch in a closed state in an instance that the photovoltaic system is in the power generating state.

18. The apparatus of claim 12, wherein the second switch operates as a normally closed switch, and
wherein the switch controller includes a second switch driving circuit configured to drive the second switch by receiving power generated by the photovoltaic system.

19. The apparatus of claim 18, wherein the second switch driving circuit is configured to be driven by the power when a control signal is received from an external control device and to open the second switch in an instance that the photovoltaic system is in the power generating state and the control signal is input.

20. The apparatus of claim 12, further comprising a third switch selectively connecting a direct current (DC) link input node of the power conversion system and the battery system.

21. The apparatus of claim 20, wherein the third switch operates in a closed state while the photovoltaic system is in the power generating state and a non-power generating state.

* * * * *